US009665668B2

(12) United States Patent
Norman et al.

(10) Patent No.: US 9,665,668 B2
(45) Date of Patent: May 30, 2017

(54) CONFIGURING A DISPATCHING RULE FOR EXECUTION IN A SIMULATION

(71) Applicant: Applied Materials, Inc., Santa Clara, CA (US)

(72) Inventors: David Everton Norman, Bountiful, UT (US); Paul D. Hoad, Fleet Hampshire (GB); Gordon Lance Jessup, West Jordan, UT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 515 days.

(21) Appl. No.: 13/779,273

(22) Filed: Feb. 27, 2013

(65) Prior Publication Data

US 2013/0226547 A1    Aug. 29, 2013

Related U.S. Application Data

(60) Provisional application No. 61/604,969, filed on Feb. 29, 2012.

(51) Int. Cl.
*G06F 17/50*    (2006.01)

(52) U.S. Cl.
CPC .......... *G06F 17/5009* (2013.01); *G05B 2219/32301* (2013.01); *Y02P 90/26* (2015.11); *Y02P 90/265* (2015.11)

(58) Field of Classification Search
None
See application file for complete search history.

(56) References Cited

U.S. PATENT DOCUMENTS

| 4,802,094 | A * | 1/1989 | Nakamura ......... G05B 19/4183 198/340 |
| 4,887,218 | A * | 12/1989 | Natarajan ............ G06Q 10/087 700/102 |
| 5,493,501 | A * | 2/1996 | Kondo ............. G05B 19/41865 700/95 |
| 6,470,231 | B1 * | 10/2002 | Yang et al. ................... 700/121 |
| 6,584,369 | B2 * | 6/2003 | Patel et al. .................... 700/100 |
| 6,615,097 | B2 * | 9/2003 | Ozaki .................... G05B 17/02 700/100 |
| 7,206,652 | B2 * | 4/2007 | Burda et al. ..................... 700/96 |
| 7,515,982 | B2 * | 4/2009 | Varadhan et al. ............ 700/100 |

(Continued)

OTHER PUBLICATIONS

K. Saito, and S. Arima "A Simulation Study on Periodical Priority Dispatching of WIP for Product-mix Fabrication" 2002 IEEE, pp. 33-37.*

(Continued)

*Primary Examiner* — Kibrom K Gebresilassie
(74) *Attorney, Agent, or Firm* — Lowenstein Sandler LLP

(57) ABSTRACT

A computer system identifies a dispatching rule that corresponds to a dispatching decision to be made in a simulation of a production environment. The dispatching rule is associated with a set of data processes. The computer system identifies a subset of the data processes that is to be executed in the simulation and executes the subset of data processes to simulate the dispatching rule to make the dispatching decision. The computing system generates a simulation decision that describes the dispatching decision made from executing the subset of data processes.

20 Claims, 8 Drawing Sheets

(56) References Cited

U.S. PATENT DOCUMENTS

| | | | |
|---|---|---|---|
| 8,108,470 B2* | 1/2012 | Lai | H04L 12/5855 700/103 |
| 8,295,965 B2* | 10/2012 | Wu et al. | 700/102 |
| 8,301,288 B2* | 10/2012 | Denton et al. | 700/100 |
| 8,510,699 B1* | 8/2013 | Acar | G06F 17/5068 716/110 |
| 2002/0032495 A1* | 3/2002 | Ozaki | G05B 17/02 700/108 |
| 2004/0267641 A1* | 12/2004 | Chang | G06Q 10/08 705/28 |
| 2005/0071031 A1* | 3/2005 | Lin | G05B 19/41865 700/101 |
| 2005/0197821 A1* | 9/2005 | Choi | G06Q 10/06 703/22 |
| 2005/0256599 A1* | 11/2005 | Peng | G06Q 10/06 700/100 |
| 2006/0095153 A1* | 5/2006 | Chang | G05B 19/4189 700/121 |
| 2006/0106477 A1* | 5/2006 | Miyashita | 700/103 |
| 2008/0120073 A1* | 5/2008 | Hara | G03F 1/144 703/6 |
| 2009/0062954 A1* | 3/2009 | Lee | G05B 19/418 700/121 |
| 2010/0185311 A1* | 7/2010 | Hsieh et al. | 700/99 |
| 2011/0029984 A1* | 2/2011 | Norman et al. | 718/106 |
| 2011/0208337 A1* | 8/2011 | Norman et al. | 700/97 |
| 2011/0252433 A1* | 10/2011 | Isoyama | G06F 9/542 719/318 |
| 2011/0255080 A1* | 10/2011 | Miyoshi | G01N 21/9501 356/237.1 |
| 2012/0124594 A1* | 5/2012 | Mikami | G06F 9/542 719/318 |

OTHER PUBLICATIONS

N. G. Pierce, and T. Yurtserver "Dyanmic Dispatch and Grpahical Monitoring System" 1999 IEEE, pp. 65-68.*

N. G. Pierce, T. Yurtsever, "Dynamic Dispatch and Graphical Monitoring System", (Herein referred as Pierce et al), 1999 IEEE, pp. 65-68.*

* cited by examiner

| LOT_ID ←501 | CURSTEP ←503 | ←500A |
|---|---|---|
| Lot1 | Step1 | |
| Lot2 | Step1 | |
| Lot3 | Step2 | |
| Lot4 | Step2 | |

| LOT_ATTRIBUTE ←505 | NAME ←507 | VALUE ←500B |
|---|---|---|
| Lot1 | Priority | 1 |
| Lot2 | Priority | 4 |
| Lot3 | Priority | 4 |
| Lot4 | Priority | 1 |

| STEP ←509 | SETUP ←511 ←500C |
|---|---|
| Step1 | Hot |
| Step2 | Cold |

CONFIGURING A DISPATCHING RULE FOR EXECUTION IN A SIMULATION

RELATED APPLICATIONS

This patent application claims the benefit under 35 U.S.C. §119(e) of U.S. Provisional Application No. 61/604,969 filed Feb. 29, 2012, which is herein incorporated by reference.

TECHNICAL FIELD

Embodiments of the present invention relate to simulation generally, and more particularly, to configuring a dispatching rule for execution in a simulation.

BACKGROUND

Dispatching rules can be used to make dispatching decisions in a production environment. A dispatching decision decides what action should happen next in the production environment. For example, the dispatching decision to be made may be "where should a wafer lot be processed next," and the dispatching rule that may be used to make the decision may be to "select the highest priority wafer lot to work on next and select a wafer lot that uses the same set up which the tool is currently configured for." A faulty dispatching rule may cause decisions that may result in equipment idle time and other inefficiencies in the production environment. Simulation technology can be used to test a dispatching rule before it is deployed in the production environment. Generally, an ideal simulation of a dispatching rule should be significantly faster than the real-time operation of the dispatching rule in the production environment. A simulation that is useable is typically much faster than real-time. However, conventional attempts at simulating a dispatching rule typically result in an unusable simulation that is extremely slow in comparison to a simulation without a dispatching rule or in comparison to a simulation with an incomplete approximation of the dispatching rule.

BRIEF DESCRIPTION OF THE DRAWINGS

Various embodiments of the present invention will be understood more fully from the detailed description given below and from the accompanying drawings of various embodiments of the invention.

FIG. 5 illustrates exemplary state data, according to some embodiments.

DETAILED DESCRIPTION

Embodiments of the invention are directed to a method and system for simulating a dispatching rule using a subset of data processes that are associated with the dispatching rule. A computing system determines that a dispatching decision should be made in a simulation of a production environment. For example, the decision that is to be made may be "where should a wafer lot be processed next in the production environment." The computing system identifies a dispatching rule that should be used to make the dispatching decision. For example, the dispatching rule may be to "select the highest priority wafer lot to work on next and select a wafer lot that uses the same set up which the tool is currently configured for". The dispatching rule may be associated with a large number of data processes that are used to implement the dispatching rule. Not all of the data processes may be needed for simulating the dispatching rule. The computing system identifies a subset of the data processes that should be executed in the simulation, for example, by locating a simulation marker in a representation of the dispatching rule to identify the subset of the data processes. In one embodiment, a representation of the dispatching rule is a data flow diagram presented in a graphical user interface (GUI).

For example, a dispatching rule may be associated with twenty or more data processes and the computing system may locate a simulation marker in the data flow diagram that indicates that three of the twenty data processes should be executed in the simulation to simulate the dispatching rule. The computing system can identify and use pre-processed data as input for the execution of the subset of data processes. For example, a dispatcher system, CIM system, etc., may have already processed data relating to the production environment, and the computing system can format the processed data as input for the subset of data processes for the simulation of the dispatching rule.

Embodiments greatly reduce the amount of time used to simulate a dispatching rule by utilizing data that already exists, identifying which of the data processes associated with a dispatching rule to use for the simulation, and simulating the identified subset(s) of the data processes.

Figure 1:
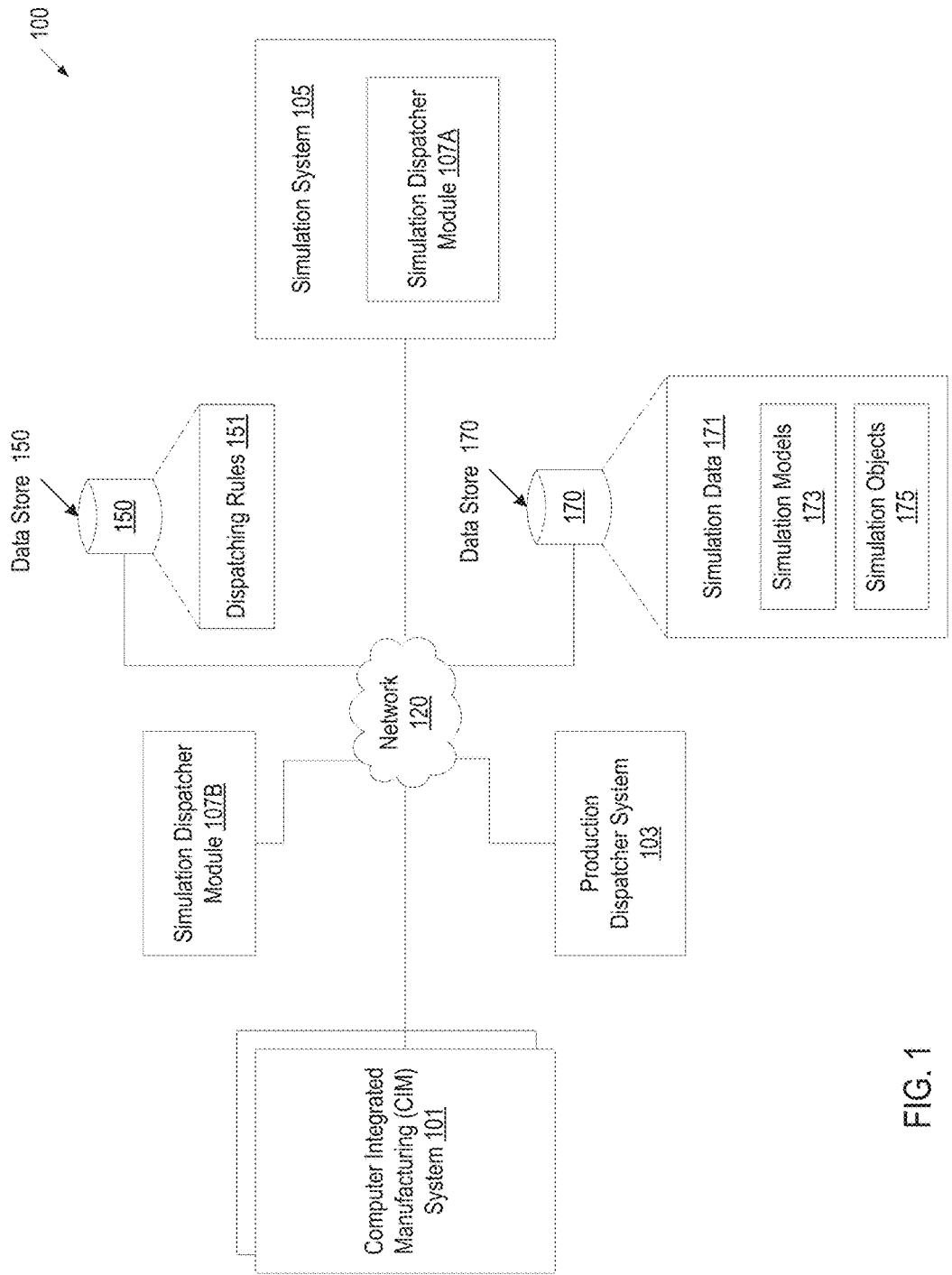
FIG. 1 is a block diagram illustrating a production environment, according to some embodiments.

FIG. 1 is a block diagram illustrating a production environment 100, according to some embodiments. A production environment 100 can include multiple systems, such as, and not limited to, a production dispatcher system 103, a simulation system 105, and one or more CIM (computed integrated manufacturing) systems 101. Examples of a production environment 100 can include, and are not limited to, a manufacturing plant, a fulfillment center, etc. For brevity and simplicity, a manufacturing plant is used as an example of a production environment 100 throughout this document. The CIM 101, production dispatcher system 103, simulation system 105, simulation dispatcher modules 107A,B, and data stores 150,170 can be coupled to each other via a network. 120. The network 120 can be a local area network (LAN), a wireless network, a mobile communications network, a wide area network (WAN), such as the Internet, or similar communication system.

The CIM systems 101, production dispatcher system 103, simulation system 105, and simulation dispatcher module 107A,B can be individually hosted or hosted in any combination together by any type of machine including server computers, gateway computers, desktop computers, laptop computers, tablet computer, notebook computer, PDA (personal digital assistant), mobile communications devices, cell phones, smart phones, hand-held computers, or similar computing device. In one embodiment the simulation dispatcher module 107A,B is part of a server that is hosted on a machine.

Examples of CIM systems 101 can include, and are not limited to, a manufacturing execution system (MES), enterprise resource planning (ERP), production planning and control (PPC), computer-aided systems (e.g., design, engineering, manufacturing, processing planning, quality assurance), computer numerical controlled machine tools, direct numerical control machine tools, controllers, etc.

The production dispatcher system 103 can make dispatching decisions for the production environment 100. A dispatching decision decides what action should happen next in the production environment 100. Examples of dispatching decisions can include, and are not limited to, where a wafer lot should be processed next in the production environment, which wafer lot should be picked for an idle piece of equipment in the production environment, etc.

The production dispatcher system 103 can use one or more dispatching rules 151 that are stored in the data store 150 to make a dispatching decision. Dispatching rules 151 can be logic that can be executed by a machine in the production dispatcher system 103 and/or by a simulation dispatcher module 107A,B. The dispatching rules 151 can be user (e.g., industrial engineer, process engineer, system engineer, etc.) defined. Examples of dispatching rules 151 can include, and are not limited to, select the highest priority wafer lot to work on next, select a wafer lot that uses the same set up which the tool is currently configured for, package items when a purchase order is complete, ship items when packaging is complete, etc.

A faulty dispatching rule may cause equipment idle time, WIP (work in progress) bubbles, and other inefficiencies in the production environment 100. Simulation technology can be used to test a dispatching rule 151 before a dispatching rule 151 is deployed to a production dispatcher system 103. A simulation system 105 can run a simulation that is generally faster than the real-time operation of the production environment 100. For example, the simulation system 105 can run a simulation for a week of simulated time in a couple of seconds to test how well the production environment 100 operates. In one embodiment, the simulation system 105 includes a simulation dispatcher module 107A to simulate dispatching rules 151. In another embodiment, the simulation system 105 communicates with an external simulation dispatcher module 107B hosted by a machine, for example, via the network 120, to simulate dispatching rules 151.

The individual dispatching rules 151 can be associated with a large number of data processes to implement the corresponding dispatching rule 151. Examples of data processes can include, and are not limited to import data, compress data, index data, filter data, perform a mathematical function on data, etc. Simulation of all of the data process can take a significant amount of time and not all of the data process should be simulated. Some examples of the data processes that should not be simulated can include and are not limited to, recreating CIM system 101 data (e.g., MES data) in the simulation. The simulation dispatcher module 107A,B can reduce the amount of simulation time by identifying which of the data processes that are associated with the dispatching rule should be simulated and which should not be simulated because their result may already be available.

The simulation dispatcher module 107A,B can also reduce the amount of simulation time by using existing data for the simulation. The simulation dispatcher module 107A,B can access simulation data 171 that is stored in the data store 170. The simulation data 171 can include data that was generated for previous simulations and can include data that is processed by other systems (e.g., CIM system 101, dispatcher system 103, etc.). The simulation data 171 can include simulation models 173 and simulation objects 175 for the simulation models 173. The simulation models 173 and simulation objects 175 can be user (e.g., process engineer, industrial engineer, system engineer, etc.) defined, and/or constructed, wholly or partially, from CIM system 101 data (e.g., MES data).

For example, the simulation dispatcher module 107A,B can reduce the simulation time from one second to a fraction of a second by identifying that three of fifty data processes that are associated with a dispatching rule should be simulated and by using existing data (e.g., existing simulation data 171, CIM system 101 data, dispatcher system 103 data, etc.) as input data for the three data processes that should be simulated.

The simulation dispatcher module 107A,B can generate a simulation decision based on the execution of the subset of data processes. The simulation decision can describe a dispatching decision that is made for simulating the dispatcher rule. For example, the decision that should be made may be "where should a wafer lot be processed next in the production environment". The simulation dispatcher module 107A,B may identify that "Dispatcher-Rule-348" should be simulated to make the decision. For example, the simulation dispatcher module 107A,B may use existing data (e.g., existing simulation data 171, CIM system 101 data, dispatcher system 103 data, etc.) to execute three of the fifty data processes that are associated with Dispatcher-Rule-348, and the simulation decision may be that "Lot-1 should be processed next by Tool-A". The simulation system 105 may perform an action based on the simulation decision. For example, the simulation system 105 may notify the production dispatcher system 103 to move Lot-1 to Tool-A.

A data store 150,170 can be a persistent storage unit. A persistent storage unit can be a local storage unit or a remote storage unit. Persistent storage units can be a magnetic storage unit, optical storage unit, solid state storage unit, electronic storage unit (main memory) or similar storage unit. Persistent storage units can be a monolithic device or a distributed set of devices. A 'set', as used herein, refers to any positive whole number of items.

Figure 2:
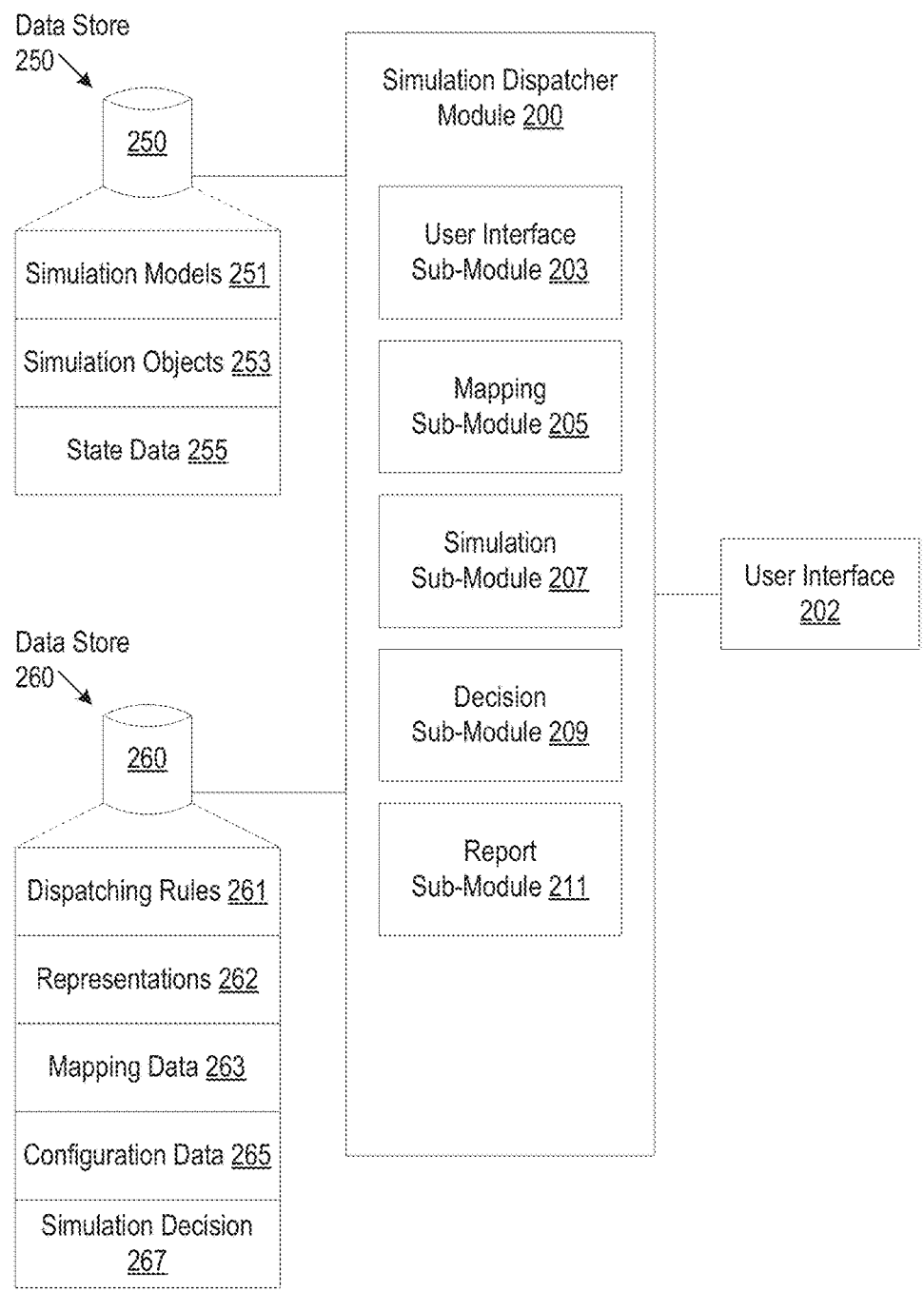
FIG. 2 is a block diagram of one embodiment of a simulation dispatcher module.

FIG. 2 is a block diagram of one embodiment of a simulation dispatcher module 200. In one embodiment, the simulation dispatcher module 200 is the same as the simulation dispatcher module 107A,B of FIG. 1. The simulation dispatcher module 200 can include a user interface sub-module 203, a mapping sub-module 205, a simulation sub-module 207, a decision sub-module 209, and a report sub-module 211.

The simulation dispatcher module 200 can be coupled to a data store 260 that stores dispatching rules 261. The dispatching rules 261 can be logic that can be executed by the simulation dispatcher module 200. The dispatching rules 261 can be user (e.g., process engineer, industrial engineer, system engineer, etc.) defined. The individual dispatching rules 261 can be associated with a large number of data processes to implement the corresponding dispatching rule 261. Examples of data processes can include, and are not limited to import data, compress data, index data, filter data, perform a mathematical function on data, etc.

The data store 260 can store representations 262 for the individual dispatching rules 261 that describe the various data processes for a corresponding dispatching rule 261. The user interface (UI) sub-module 203 can provide a user interface 202 to present representations 262 of the dispatching rules 261. The UI 202 can be a graphical user interface. In one embodiment, a representation 262 of a dispatching rule 261 is a data flow diagram presented in the UI 202 that includes UI process elements (e.g., blocks) that represent the data processes that are associated with the dispatching rule 261 and UI connector elements (e.g., arrows) connecting the UI process elements (e.g., blocks) to represent the data flow for the data processes.

Not all of the data processes that are associated with a dispatching rule 261 should be simulated. The representations 262 can include one or more simulation markers to identify a subset of the data processes that should be simulated. The simulation markers can be UI elements (e.g., simulation blocks, markings, macro blocks, function blocks, etc.). The UI sub-module 203 can receive input from a user (e.g., process engineer, industrial engineer, system engineer, etc.) via the UI 202 for adding a simulation marker to the representation of the dispatching rule 261. For example, a dispatching rule 261 "Dispatch-Rule-588" may be associated with twenty or more data processes, and the UI sub-module 203 may receive input of a simulation block UI element being added to the representation 261 (e.g., data flow diagram) via UI 202 to indicate that three of the twenty processes should be executed to simulate Dispatch-Rule-588. One implementation of a representation including a simulation marker is described in greater detail below in conjunction with FIG. 3.

In one embodiment, the UI sub-module 203 receives input to add a simulation block UI element to the representation 262 as the simulation marker to indicate the starting point for executing a simulation of the dispatching rule. In another embodiment, the UI sub-module 203 receives input to mark a UI element (e.g., arrow) in the representation 262 as the simulation marker. In another embodiment, the UI sub-module 203 receives input to split a dispatching rule 261 into multiple pieces (e.g., two pieces), for example, using a macro block and/or function block. The macro block or function block can include the subset of data processes that should not be executed in a simulation of the dispatching rule. The pieces other than the macro block or the function block can represent the subset of data processes that should be executed in a simulation of the dispatching rule. In another embodiment, a representation 262 of a dispatching rule 261 is made using code in a high-level language. The dispatching rule code can be changed to include a main function that identifies the subset of data processes that should be executed in a simulation and a sub-function that identifies the data processes that should not be executed in a simulation. When running the simulation, the main function is executed and the sub-function can be replaced with a different sub-function that obtains the input data from the simulation and provides the input data to the main function.

The data store 260 can store multiple dispatching rules 261 and a representation 262 for each dispatching rule 261. The individual representations 262 can include one or more simulation markers. The individual simulation markers are associated with a subset of data processes that should be executed in a simulation for the corresponding dispatching rule 261. The individual simulation markers can each be associated with mapping data 263 that identifies the data that should be used as input for the subset of data processes that are associated with the simulation marker. The mapping sub-module 205 can generate the mapping data 263 for the individual simulation markers and can store the mapping data 263 in the data store 260. The mapping data 263 can be configured from user (e.g., process engineer, industrial engineer, system engineer, etc.) input that is received via the UI 202.

The mapping sub-module 205 can perform a one-time setup of the mapping data 263 based on the data processes of the dispatching rule 261. The mapping sub-module 205 can update the mapping data 263, for example, if changes are made to the data processes of the dispatching rule 261. The mapping sub-module 205 can examine the data processes in the dispatching rule representation 262 to determine what data is flowing as input data to each of the simulation markers and create mapping data 263 based on the input data that is flowing to the corresponding simulation marker.

The mapping data 263 for a simulation marker in a representation 262 can include the input parameters associated with the particular simulation marker and information to locate the values for the input parameters. In one embodiment, the mapping data 263 includes one or more tables that include the input parameters and pointers to locations of the values for each of the input parameters. One implementation of mapping data is described in greater detail below in conjunction with FIG. 4.

The input data for the subset of data processes can be existing data that is stored in one or more data stores 250,260 that are coupled to the simulation module 200. For example, the existing data that can be used as input can include simulation objects 253 that are used for simulation models 251. In another example, the existing data that can be used as input can include the state data 255 that is stored in the data store 250. The state data 255 can include data that describes a state of the production environment. The state data 255 can be prepared by other systems (e.g., dispatcher system, CIM system, etc.) and can be used in the production environment. In one embodiment, the state data 255 is created and stored by one or more systems (e.g., CIM system, production dispatcher system, etc.) and is accessed by the simulation dispatcher module 200. For example, the state data 255 can be database tables that include data representing CIM system data of the factory, such as MES data. One example of state data is described in greater detail below in conjunction with FIG. 5, according to one implementation.

The simulation sub-module 207 can be coupled to a data store 250 that stores simulation models 251 for simulating a current state of a production environment. The simulation models 251 can be based on the simulation objects 253. The simulation models 251 and simulation objects 253 can be user (e.g., process engineer, industrial engineer, system engineer, etc.) defined. The simulation models 251 and objects 253 can also be updated and/or populated based on CIM system data (e.g., MES data) and/or dispatcher system data.

The simulation sub-module 207 can execute one or more simulation models 251 to simulate a production environment. At some point during the simulation, the simulation should make a dispatching decision. For example, a simulation can trigger (e.g., call) the decision sub-module 209 to make the decision using a corresponding dispatching rule 261. In one implementation, the decision sub-module 209 uses a dispatching rule identifier that is in the simulation models 251 to identify which dispatching rule 261 to use. In another implementation, the decision sub-module 209 receives user (e.g., process engineer, system engineer, industrial engineer, etc.) input of an identifier of the dispatching rule 251 that should be simulated for the decision. The decision sub-module 209 can receive the user input via the UI 202.

The decision sub-module 209 can examine the representation 262 for the dispatching rule 261 to search for one or more simulation markers in the representation 262 when the dispatching rule 261 is identified. The decision sub-module 209 can identify the mapping data 263 that is associated with the simulation marker to identify the input data (e.g., data from simulation objects 253, data from state data 255) that should be used for executing the subset of data processes that are associated with the simulation marker. Various implementations of associating mapping data with simulation markers are described in greater detail below in conjunction with FIG. 3. The decision sub-module 209 can use information in the mapping data 263 to locate the values for the input data.

The decision sub-module 209 can format the values as input data for executing the subset of data processes for the simulation. The format for the input data can be specified in configuration data 265 that is stored in the data store 260. The configuration data 265 can be predefined. The configuration data 265 can be user defined. In one embodiment, the decision sub-module 210 generates an input table, which includes the values of the input parameters, for the subset of data processes for each simulation marker. One implementation of an input table is described in greater detail below in conjunction with FIG. 6. The decision sub-module 209 can use the formatted input data to execute the subset of data processes that are associated with the simulation marker to simulate the dispatching rule 261 to make a simulation decision 267. The data store 260 can store simulation decisions 267 for various simulations of dispatching rules 261. A simulation decision 267 describes the dispatching decision that is made for a corresponding simulation marker for a dispatching rule 261.

For example, during a simulation of the production environment by one or more simulation models 251, the simulation may call the decision sub-module 210 to make a dispatching decision for "where should a wafer lot be processed next in the production environment." The decision sub-module 210 may determine that Dispatch-Rule-588 should be simulated to make the decision. Dispatch-Rule-588 may be to "select the highest priority wafer lot to work on next and select a wafer lot that uses the same set up which the tool is currently configured for." The decision sub-module 210 may locate a simulation marker in the representation 262 of Dispatch-Rule-588. The decision sub-module 210 can use mapping data 263 that is associated with the simulation marker to identify that the input data that should be used to simulate the subset of data process that are associated with the simulation marker. For example, the mapping data 263 may point to locations for "wafer lots" data, "priority of the wafer lots" data, and "setup for the wafer lots" data in state data 255. The decision sub-module 210 can obtain the input data and format the input data. The decision sub-module 210 can use the formatted input data to execute the subset of data processes to generate a simulation decision 267. The simulation decision 267 may be that "Tool-A should work on Lot-1 next".

The simulation sub-module 207 can run a simulation model 251 to represent an extended amount of production environment time. For example, the simulation sub-module 207 runs a simulation model 251 to simulate the one week of operation of the production environment. During that simulation, a significant number of dispatching decisions may be made. The report sub-module 211 can collect data from the simulation and generate a report. The report can include for example, and is not limited to, average cycle time, average production throughput, average equipment utilization, etc. The report sub-module 211 can provide the report to one or more users (e.g., industrial engineers, process engineers, system engineers, etc.), for example, via an electronic message (e.g., email message, text message, social networking message, etc.). The UI sub-module 203 can present the report in the UI 202.

The data stores 250,260 can be a persistent storage unit. A persistent storage unit can be a local storage unit or a remote storage unit. Persistent storage units can be a magnetic storage unit, optical storage unit, solid state storage unit, electronic storage unit (main memory) or similar storage unit. Persistent storage units can be a monolithic device or a distributed set of devices. A 'set', as used herein, refers to any positive whole number of items.

Figure 3:
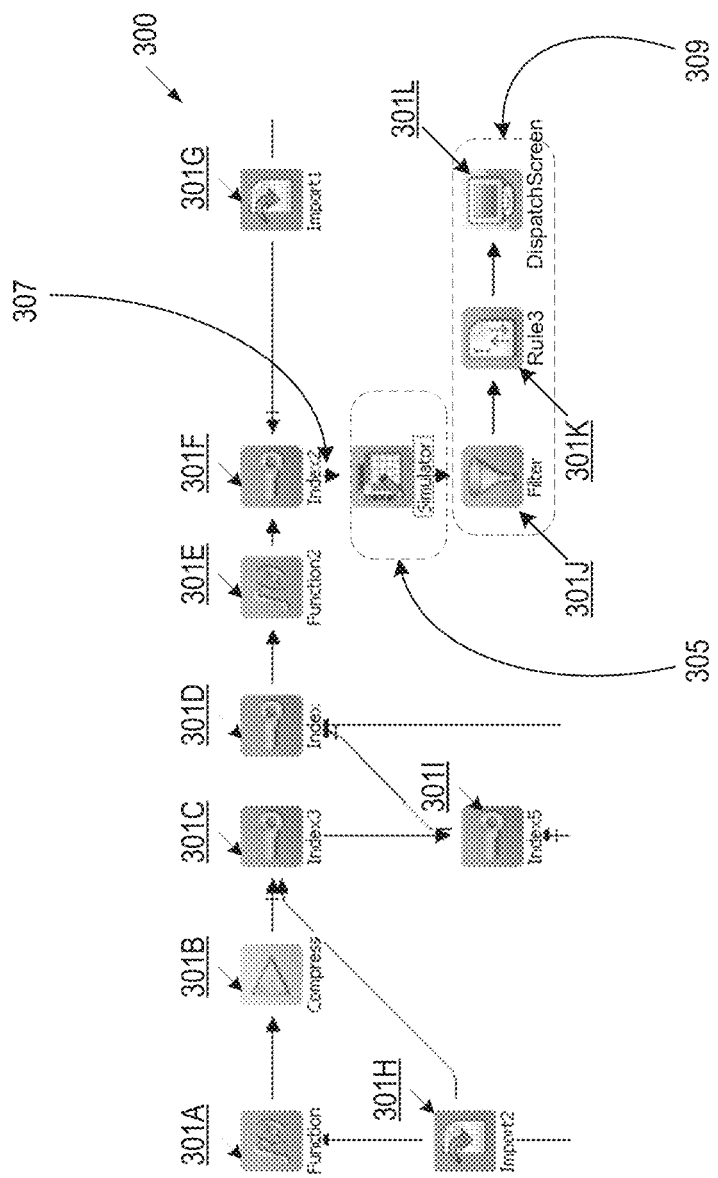
FIG. 3 illustrates a portion of an exemplary representation of a dispatching rule, according to some embodiments.

FIG. 3 illustrates a portion of an exemplary representation 300 of a dispatching rule, according to some embodiments. The representation 300 can be a data flow diagram that includes UI elements (e.g., blocks) that represent the data processes that are associated with the dispatching rule and UI element (e.g., arrows) that are connecting the blocks to represent the data flow for the data processes.

For example, dispatching rule "Dispatch-Rule-348" may be associated with at least twenty data processes, as represented by blocks 301A-L in the representation 300. Not all of the data processes that are associated with a dispatching rule should be executed in a simulation. The representation 300 of the dispatching rule can include one or more simulation markers that indicate one or more subsets of the data processes that should be executed in a simulation for a dispatching rule. A simulation marker can be a UI element (e.g., block). For example, representation 300 may include a simulation marker 305 indicating that three of the twenty data processes should be executed in the simulation for the dispatching rule. For example, the simulation marker 305 may indicate that the subset 309 of data processes 301J-L should be executed in the simulation. Other data processes (e.g., data processes 301A-I) should not to be executed in the simulation.

The simulation marker 305 and the subset 309 of data processes that correspond to the simulation marker 305 can be associated with existing data that can be used as input when executing the subset 309 of data processes in the simulation. The simulation marker 305 can be associated with mapping data that identifies the data that should be used as input for the subset 309 of data processes.

In one embodiment, the simulation marker is a block that includes the corresponding mapping data 263. In one embodiment, the block includes a pointer to the corresponding mapping data 263 for the simulation block in the data store 260. In one embodiment, the simulation marker is a mark on an arrow and the corresponding mapping data 263 for the simulation marker can be a UI element (e.g., pop-up window) that is attached to the arrow. In one embodiment, the mark on the arrow includes a pointer to the corresponding mapping data 263 in the data store 260. In one embodiment, a macro block or a function block is used as a simulation marker and the macro block or the function block includes the corresponding mapping data 263. In one embodiment, the macro block or the function block includes a pointer to the corresponding mapping data 263 for the simulation block in the data store 260. In one embodiment, a main function and a sub-function are used as a simulation marker, and the sub-function includes the corresponding mapping data 263. In one embodiment, the sub-function includes a pointer to the corresponding mapping data 263 in the data store 260.

Figure 4:
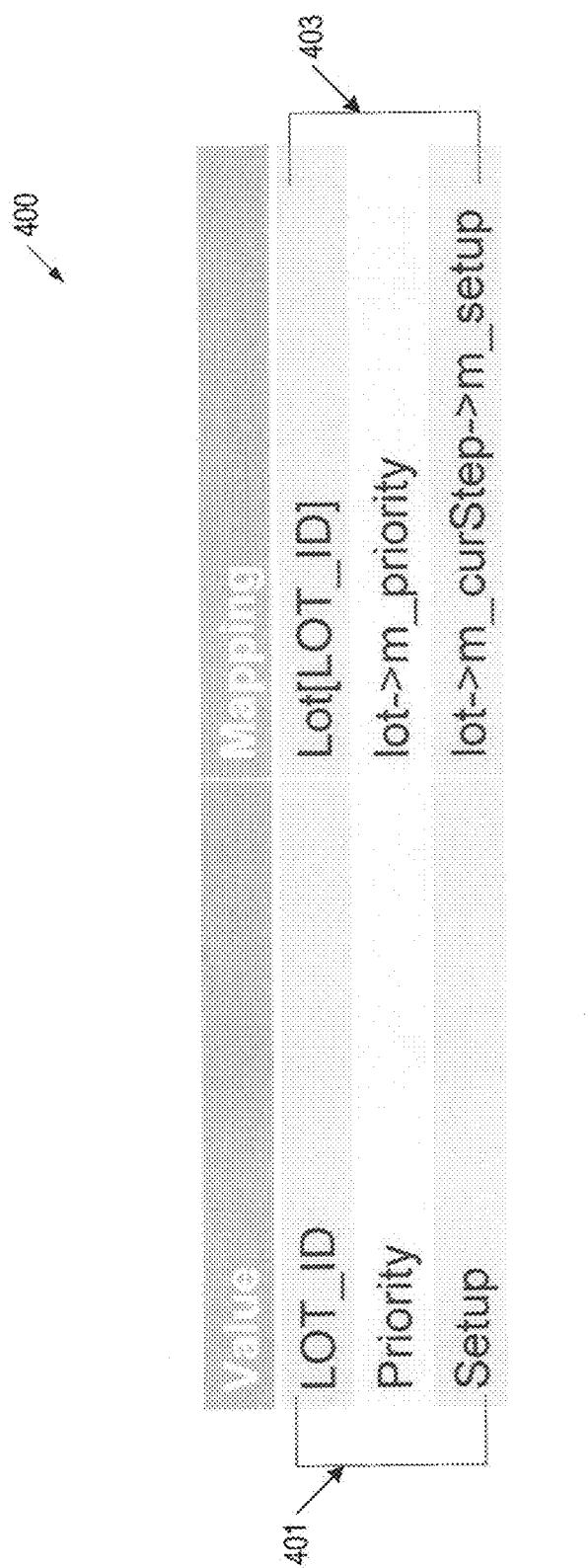
FIG. 4 illustrates exemplary mapping data corresponding to a simulation marker, according to some embodiments.

FIG. 4 illustrates exemplary mapping data 400 corresponding to a simulation marker, according to some embodiments. The mapping data 400 includes the types of input parameters 401 and pointers 403 to the locations that contain the values for the input parameters 401. The locations (e.g., pointers 403) in the mapping data 400 can be used to obtain the values of the input parameters 401. The locations may be in simulation objects and/or state data.

FIG. 5 illustrates exemplary state data, according to some embodiments. The state data are database tables 500A,B,C. Database table 500A includes MES data describing the wafer lots 501 of the production environment and the current process step 503 where a wafer lot is located. Database table 500B includes MES data describing an attribute and an attribute value for the wafer lots. For example, database table 500B has a priority attribute 505 and the priority value 507 assigned to the wafer lots. The attribute can be a user-defined attribute. Database table 500C includes MES data describing a tool setup 511 for the process steps 509. The mapping data for a simulation marker may identify at least a portion of state data that can be formatted as input data for a subset of data processes. For example, some of the state data can be used to populate an input table.

Figure 6:
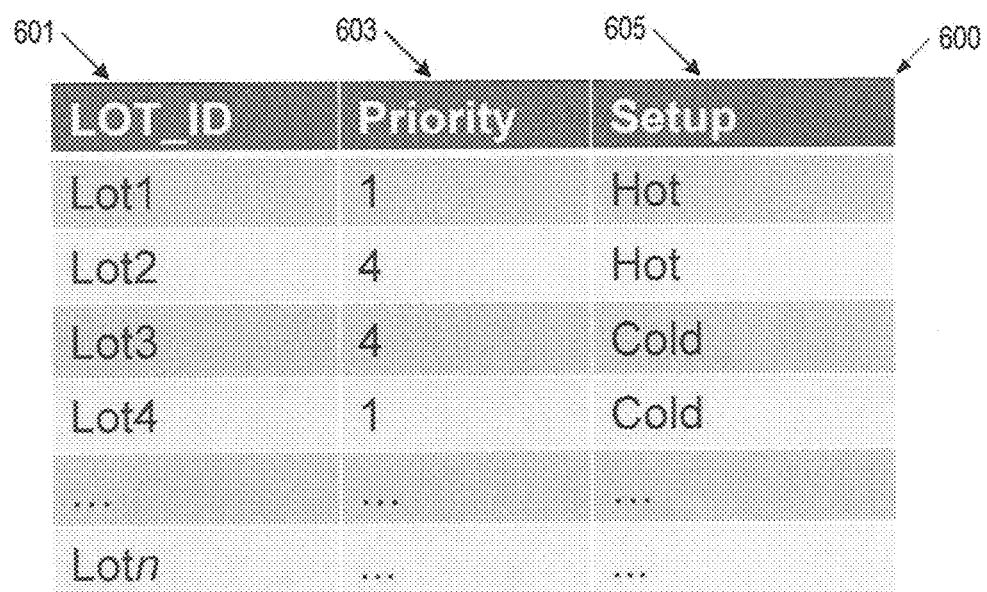
FIG. 6 illustrates an exemplary input table for executing a subset of data processes of a dispatching rule in a simulation, according to some embodiments.

FIG. 6 illustrates an exemplary input table 600 for executing the subset of data processes of a dispatching rule in a simulation, according to some embodiments. Input table 600 includes the lot values 601, the priority values 603 for the lots, and the tool setup 605 required to process the corresponding lot.

Figure 7:
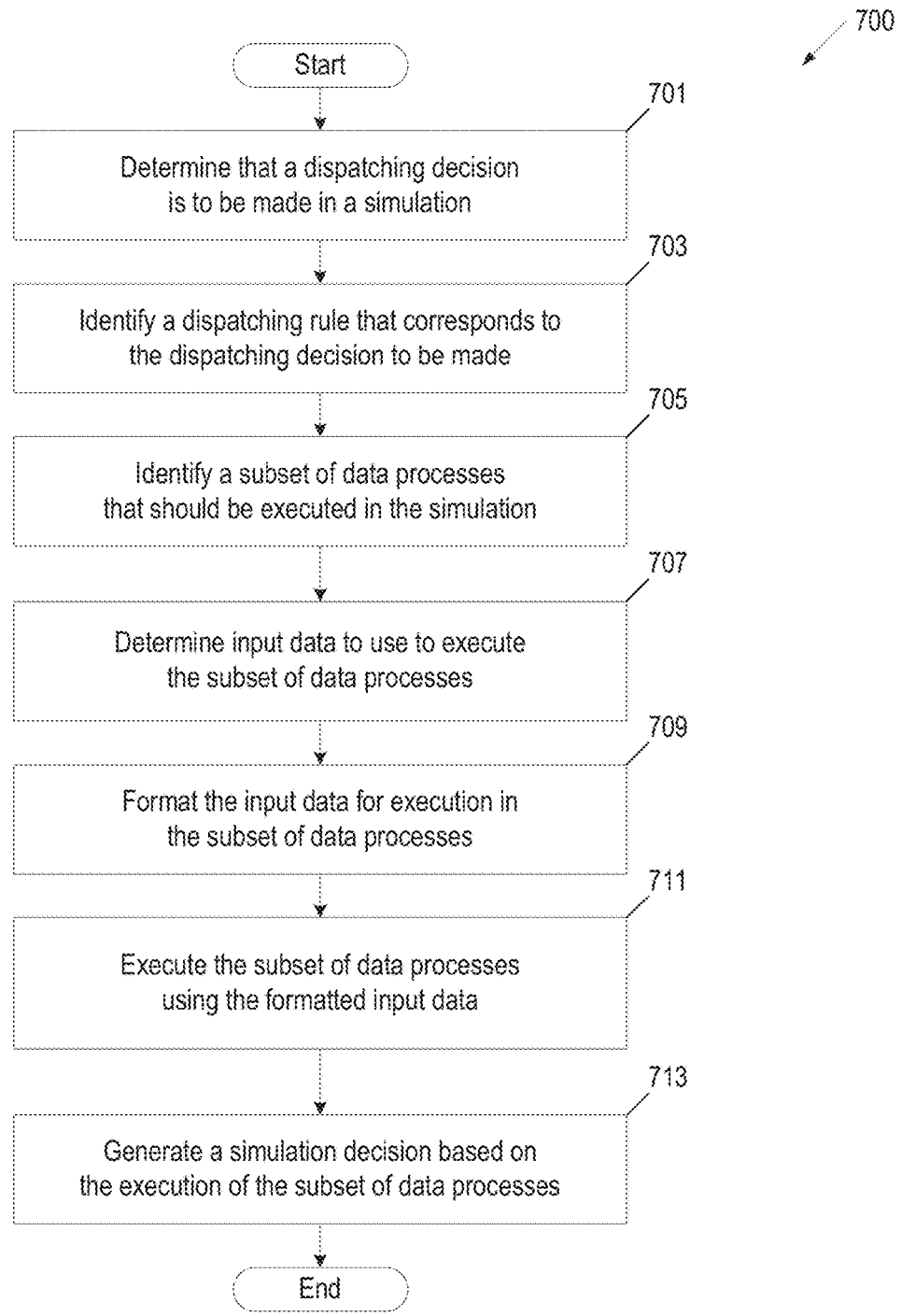
FIG. 7 is a flow diagram of an embodiment of a method for simulating a dispatching rule using a subset of data processes that are associated with the dispatching rule.

FIG. 7 is a flow diagram of an embodiment of a method 700 for simulating a dispatching rule using a subset of data processes that are associated with the dispatching rule. Method 700 can be performed by processing logic that can comprise hardware (e.g., circuitry, dedicated logic, programmable logic, microcode, etc.), software (e.g., instructions run on a processing device), or a combination thereof. In one embodiment, method 700 is performed by the simulation dispatcher module 107A,B hosted by a computing device of FIG. 1. Method 700 can be an iteratively executed any number of times in a given simulation run.

At block 701, processing logic determines that a dispatching decision should be made in a simulation of a production environment. For example, processing logic may be executing a simulation model of a current state of the factory and processing logic may detect from the simulation model that a dispatching decision should be made. For example, the decision may be "where should a wafer lot be processed next in the production environment." The simulation model can include an identifier of the dispatching decision to be made.

At block 703, processing logic identifies a dispatching rule that corresponds to the dispatching decision that should be made. Processing logic can use the identifier of the dispatching decision to locate a corresponding dispatching rule. The dispatching rule can be associated with a large number of data processes. At block 705, processing logic identifies a subset of data processes that should be executed to simulate the dispatching rule. Process logic can identify one or more simulation markers in a representation of the dispatching rule to identify the subset of data processes that should be executed in the simulation. At block 707, processing logic determines input data that should be used to execute the subset of data processes. Processing logic can identify mapping data that is associated with the simulation marker and can obtain the data which the mapping data points to. For example, the mapping data may indicate that the input parameters are lot ID, lot priority, and lot setup and can locate the values for the input parameters in the simulation objects and/or state data.

At block 709, processing logic formats the input data for execution in the subset of data processes. For example, processing logic may generate a table and may populate the table with the values of the input parameters for the simulation marker. At block 711, processing logic executes the subset of data processes using the formatted input data to simulate the dispatching rule. At block 713, processing logic generates a simulation decision based on the execution of the subset of data processes. A simulation decision describes the dispatching decision that is made from simulating the dispatching rule using the subset of data processes that are associated with the simulation marker. A production dispatcher in the production environment can perform an action based on the simulation decision and processing logic can update the simulation data (e.g., simulation objects) based on the action performed by the production dispatcher.

For example, during a simulation, processing logic may determine that a decision as to "where should a wafer lot be processed next in the production environment" should be made. Processing logic may identify that Dispatching-Rule-A corresponds to the decision. Dispatching-Rule-A may be to "select the highest priority wafer lot to work on next and select a wafer lot that uses the same set up which the tool is currently configured for." Processing logic may identify a simulation marker in the representation of the Dispatching-Rule-A that indicates that three of the twenty data processes that are associated with Dispatching-Rule-A should be executed in the simulation. Processing logic may identify mapping data that is associated to the simulation marker and may determine from the mapping data that the input parameters for subset of data processes are lot ID, lot priority, and lot setup. Processing logic may use pointers in the mapping data to obtain the values for the lot ID, lot priority, and lot setup from the simulation objects and/or state data. Processing logic may format the values to be used as input to execute the subset of data processes. Processing logic may generate a simulation decision that describes that "Tool-A should work on Lot-1 next." The production dispatcher may move Lot-1 to Tool-A and processing logic can update the simulation data by assigning Lot-1 to the Tool-A.

Figure 8:
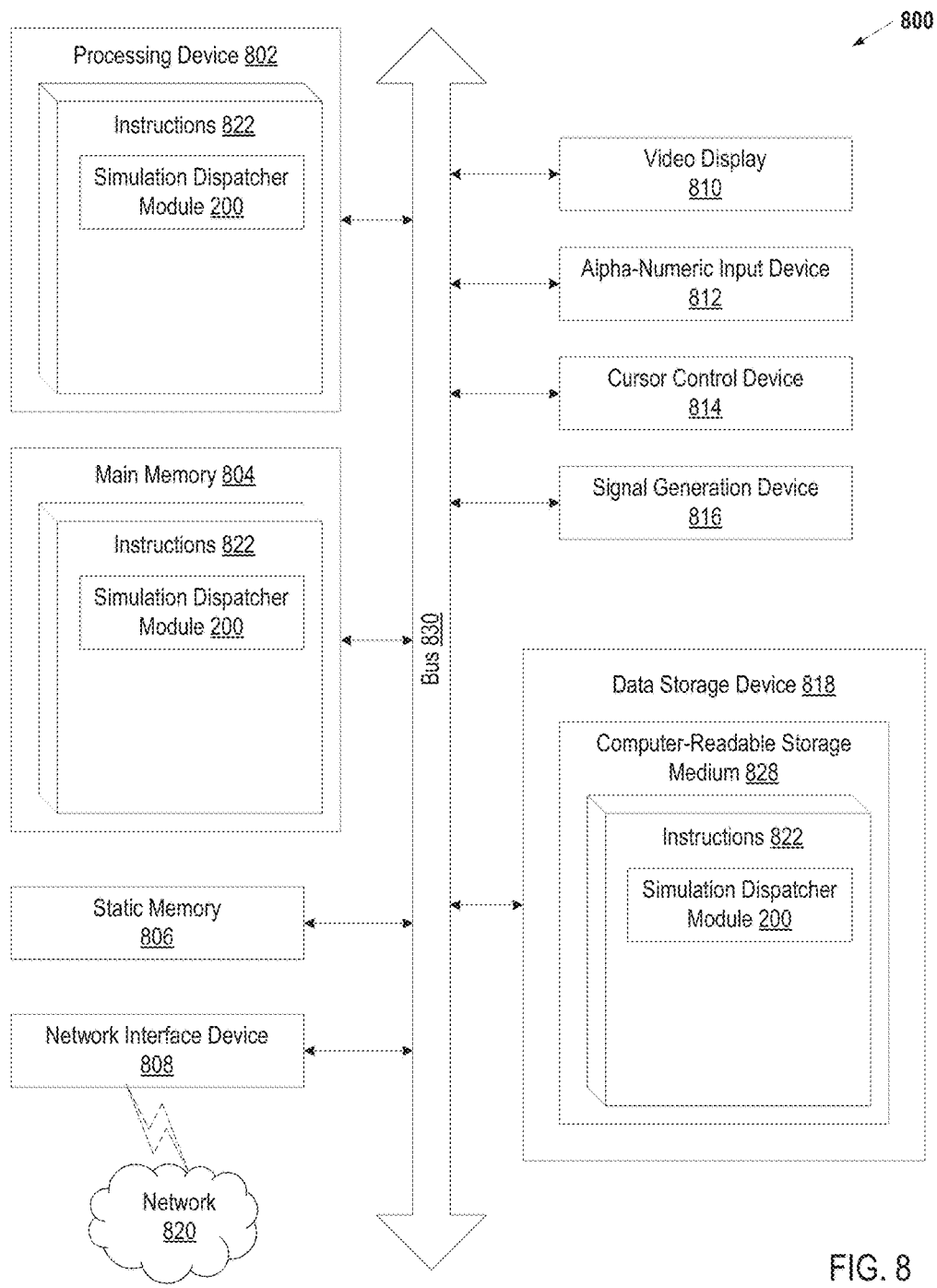
FIG. 8 illustrates an exemplary computer system.

FIG. 8 illustrates a diagram of a machine in the exemplary form of a computer system 800 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 800 includes a processing device (processor) 802, a main memory 804 (e.g., read-only memory (ROM), flash memory, dynamic random access memory (DRAM) such as synchronous DRAM (SDRAM), double data rate (DDR SDRAM), or DRAM (RDRAM), etc.), a static memory 806 (e.g., flash memory, static random access memory (SRAM), etc.), and a data storage device 818, which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 802 may also be one or more special-purpose processing devices such as an application specific integrated circuit (ASIC), a field programmable gate array (FPGA), a digital signal processor (DSP), network processor, or the like. The processor 802 is configured to execute instructions 822 for performing the operations and steps discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The data storage device 818 may include a computer-readable storage medium 828 on which is stored one or more sets of instructions 822 (e.g., software) embodying any one or more of the methodologies or functions described herein. The instructions 822 may also reside, completely or at least partially, within the main memory 804 and/or within the processor 802 during execution thereof by the computer system 800, the main memory 804 and the processor 802 also constituting computer-readable storage media. The instructions 822 may further be transmitted or received over a network 820 via the network interface device 808.

In one embodiment, the instructions 822 include instructions for a simulation dispatcher module (e.g., simulation dispatcher module 200 of FIG. 2) and/or a software library containing methods that call a simulation dispatcher module. While the computer-readable storage medium 828 (machine-readable storage medium) is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

In the foregoing description, numerous details are set forth. It will be apparent, however, to one of ordinary skill in the art having the benefit of this disclosure, that the present invention may be practiced without these specific details. In some instances, well-known structures and devices are shown in block diagram form, rather than in detail, in order to avoid obscuring the present invention.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "identifying", "executing", "generating," "receiving", "sending", "determining", "updating", or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The present invention also relates to an apparatus for performing the operations herein. This apparatus may be constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    identifying a dispatching rule corresponding to a dispatching decision to be made in a simulation of a production environment, wherein the dispatching rule is associated with a plurality of data processes;
    identifying, by a computing system, a simulation marker in a representation of the dispatching rule in a graphical user interface, the simulation marker indicating a subset of the plurality of data processes that correspond to the dispatching rule, the subset of the plurality of data processes to be executed in the simulation;
    executing the subset of data processes to simulate the dispatching rule to make the dispatching decision; and
    generating a simulation decision that describes the dispatching decision made from executing the subset of data processes.

2. The method of claim 1, further comprising:
    presenting the representation of the dispatching rule in the graphical user interface;
    receiving a user selection of a user interface element as the simulation marker.

3. The method of claim 1, wherein the simulation marker comprises at least one of a block user interface element, a marking of a user interface element, a macro block, or a function block.

4. The method of claim 1, wherein the representation of the dispatching rule comprises a data flow diagram in the graphical user interface, the data flow diagram comprising user interface elements corresponding to the plurality of data processes.

5. The method of claim 1, wherein executing the subset of data processes to simulate the dispatching rule to make the dispatching decision comprises:
identifying input data for the subset of data processes that corresponds to the simulation marker using mapping data that is associated with the simulation marker, the input data being pre-processed data; and
executing the subset of data processes using the pre-processed data.

6. The method of claim 1, wherein identifying the simulation marker comprises:
receiving user input, via the graphical user interface, identifying the simulation marker to add to the representation.

7. The method of claim 1, further comprising:
sending the simulation decision to a dispatcher system;
determining a change that is made to the production environment based on the simulation decision; and
receiving updated state data to reflect the change.

8. A non-transitory computer-readable storage medium including instructions that, when executed by a processing device, cause the processing device to perform operations comprising:
identifying a dispatching rule corresponding to a dispatching decision to be made in a simulation of a production environment, wherein the dispatching rule is associated with a plurality of data processes;
identifying, by the processing device, a simulation marker in a representation of the dispatching rule in a graphical user interface, the simulation marker indicating a subset of the plurality of data processes that correspond to the dispatching rule, the subset of the plurality of data processes to be executed in the simulation;
executing the subset of data processes to simulate the dispatching rule to make the dispatching decision; and
generating a simulation decision that describes the dispatching decision made from executing the subset of data processes.

9. The non-transitory computer-readable storage medium of claim 8, the operations further comprising:
presenting the representation of the dispatching rule in the graphical user interface;
receiving a user selection of a user interface element as the simulation marker.

10. The non-transitory computer-readable storage medium of claim 8, wherein the simulation marker comprises at least one of a block user interface element, a marking of a user interface element, a macro block, or a function block.

11. The non-transitory computer-readable storage medium of claim 8, wherein the representation of the dispatching rule comprises a data flow diagram in the graphical user interface, the data flow diagram comprising user interface elements corresponding to the plurality of data processes.

12. The non-transitory computer-readable storage medium of claim 8, wherein executing the subset of data processes to simulate the dispatching rule to make the dispatching decision comprises:
identifying input data for the subset of data processes that corresponds to the simulation marker using mapping data that is associated with the simulation marker, the input data being pre-processed data; and
executing the subset of data processes using the pre-processed data.

13. The non-transitory computer-readable storage medium of claim 8, wherein identifying the simulation marker comprises:
receiving user input, via the graphical user interface, identifying the simulation marker to add to the representation.

14. The non-transitory computer-readable storage medium of claim 8, further comprising:
sending the simulation decision to a dispatcher system;
determining a change that is made to the production environment based on the simulation decision; and
receiving updated state data to reflect the change.

15. A system comprising:
a memory to store a plurality of keys; and
a processing device coupled to the memory to:
identify a dispatching rule corresponding to a dispatching decision to be made in a simulation of a production environment, wherein the dispatching rule is associated with a plurality of data processes;
identify a simulation marker in a representation of the dispatching rule in a graphical user interface, the simulation marker indicating a subset of the plurality of data processes that correspond to the dispatching rule, the subset of the plurality of data processes to be executed in the simulation;
execute the subset of data processes to simulate the dispatching rule to make the dispatching decision; and
generate a simulation decision that describes the dispatching decision made from executing the subset of data processes.

16. The system of claim 15, wherein the processing device is further to:
receive a user selection of a user interface element as the simulation marker.

17. The system of claim 15, wherein the simulation marker comprises at least one of a block user interface element, a marking of a user interface element, a macro block, or a function block.

18. The system of claim 15, wherein the representation of the dispatching rule comprises a data flow diagram in the graphical user interface, the data flow diagram comprising user interface elements corresponding to the plurality of data processes.

19. The system of claim 15, wherein executing the subset of data processes to simulate the dispatching rule to make the dispatching decision comprises:
identifying input data for the subset of data processes that corresponds to the simulation marker using mapping data that is associated with the simulation marker, the input data being pre-processed data; and
executing the subset of data processes using the pre-processed data.

20. The system of claim 15, wherein identifying the simulation marker comprises:
receiving user input, via the graphical user interface, identifying the simulation marker to add to the representation.

* * * * *